United States Patent [19]

Shimizu et al.

[11] Patent Number: 4,833,619
[45] Date of Patent: May 23, 1989

[54] AUTOMATIC LOGIC DESIGN SYSTEM

[75] Inventors: Tsuguo Shimizu, Sayama; Yoshio Takamine, Kokubunji, both of Japan

[73] Assignee: Hitachi, Ltd., Tokyo, Japan

[21] Appl. No.: 945,946

[22] Filed: Dec. 24, 1986

[30] Foreign Application Priority Data

Jan. 8, 1986 [JP] Japan .................................. 61-568

[51] Int. Cl.$^4$ ............................................. G06F 15/60
[52] U.S. Cl. ..................... 364/489; 364/900; 364/947
[58] Field of Search ... 364/200 MS File, 900 MS File, 364/488, 489, 490, 491

[56] References Cited

U.S. PATENT DOCUMENTS

| | | | |
|---|---|---|---|
| 4,580,228 | 4/1986 | Noto | 364/491 |
| 4,584,653 | 4/1986 | Chih et al. | 364/491 |
| 4,600,995 | 7/1986 | Kinoshita | 364/491 |
| 4,612,618 | 9/1986 | Pryor et al. | 364/490 |
| 4,613,940 | 9/1986 | Shenton et al. | 364/490 |
| 4,636,965 | 1/1987 | Smith et al. | 364/491 |
| 4,638,442 | 1/1987 | Bryant et al. | 364/489 |
| 4,651,284 | 3/1987 | Watanabe et al. | 364/491 |
| 4,752,887 | 6/1988 | Kuwahara | 364/491 |

*Primary Examiner*—Gareth D. Shaw
*Assistant Examiner*—Kevin A. Kriess
*Attorney, Agent, or Firm*—Saidman, Sterne, Kessler & Goldstein

[57] ABSTRACT

Herein disclosed is an automatic design system for automatically generating a data structure, which is only implicitly expressed by a logic specification description, by deriving, in case a logic system has data structures of similar constructions, one data structure from the structure description and transfer behavior description of the other data structure.

8 Claims, 10 Drawing Sheets

< OPERATION-A >

(1) AREG ← $IN_0$ (2) CREG ← AREG (3) if (REL $SK_0$ (0)) then DREG ← CREG

< OPERATION-B >

(1) AREG ← $IN_0$ (2) CREG ← AREG (3) if (REL $SK_0$ (1)) then EREG ← CREG

< OPERATION-C >

(1) BREG ← $IN_1$ (2) CREG ← BREG (3) if (REL $SK_1$ (0)) then DREG ← CREG

< OPERATION-D >

(1) BREG ← $IN_1$ (2) CREG ← BREG (3) if (REL $SK_1$ (1)) then EREG ← CREG

FIG. 4

STRUCTURE DESCRIPTION TABLE 400

| LOGIC ELEMENT | SOURCE | SINK |
|---|---|---|
| AREG | $IN_0$ | SELD |
| BREG | $IN_1$ | SELD |
| CREG | SELD | DREG |
| | | EREG |
| DREG | CREG | $OUT_0$ |
| EREG | CREG | $OUT_1$ |
| | | |
| SELD $in_0$ | AREG | CREG |
| SELD $in_1$ | BREG | |
| | | |

FIG. 5

BEHAVIOR DESCRIPTION TABLE 500

| SEQUENCE | STEP | DATA TRANSFER | TRANSFER CONDITION |
|---|---|---|---|
| OPERATION -A | (1) | AREG ← $IN_0$ | — |
|  | (2) | CREG ← AREG | — |
|  | (3) | DREG ← CREG | REL $SK_0$ (0) |
| OPERATION -B | (1) | AREG ← $IN_0$ | — |
|  | (2) | CREG ← AREG | — |
|  | (3) | EREG ← CREG | REL $SK_0$ (1) |
| OPERATION -C | (1) | BREG ← $IN_1$ | — |
|  | (2) | CREG ← BREG | — |
|  | (3) | DREG ← CREG | REL $SK_1$ (0) |
| OPERATION -D | (1) | BREG ← $IN_1$ | — |
|  | (2) | CREG ← BREG | — |
|  | (3) | EREG ← CREG | REL $SK_1$ (1) |
| ⋮ | ⋮ | ⋮ | ⋮ |

DATA STRUCTURE GENERATION RESULT TABLE 600

| LOGIC ELEMENT | SOURCE | DESTINATION |
|---|---|---|
| areg | $SK_0$ | creg |
| creg | areg | $CTL_0$ |
| | | $CTL_1$ |
| breg | $SK_1$ | creg' |
| creg' | breg | $CTL_0$ |
| | | $CTL_1$ |
| | ⇩ | |
| areg | $SK_0$ | SELC |
| breg | $SK_1$ | SELC |
| SELC | areg | creg |
| SELC | breg | |
| creg | SELC | $CTL_0$ |
| | | $CTL_1$ |
| ∫ | ∫ | ∫ |

FIG. 8

AUTOMATIC LOGIC DESIGN SYSTEM

BACKGROUND OF THE INVENTION

The present invention relates to an automatic logic design system for accomplishing the logic design of a digital hardware system by a computer.

Generally speaking, the design of a computer is conducted through the steps of architecture design, logic design, physical design and test. The physical design and later steps has been drastically automated by the development of DA (which is the abbreviation of "Design Automation" of recent years, as is disclosed in Japanese Patent Laid-Open No. 60317/1983).

For the steps of the architecture design and the logic design, on the other hand, trials have been made to improve the design method and automation. However, the design workload for those steps has not been reduced. Especially, large-scale computers commonly take their design terms in years.

As the semiconductor technology advances in recent years, moreover, there appears the VLSI which has a great number of gates built therein. However, there is not established yet a logic design method of making effective use of that development of the semiconductor technology.

SUMMARY OF THE INVENTION

An object of the present invention is to provide an automatic logic design system for automatically conducting the logic design by a computer to reduce the design workload of the step.

It is a common practice that the logic designer selects a function to be realized in a system to be designed and determines a rough block diagram for realizing the function. Then, the logic designer refines the implementation of the function taking a variety of restrictions into consideration.

When such a hardware system is to be automatically designed, it is necessary to input a data structure determined in the block diagram and behavior information of the hardware system to an automatic design system.

Portions having similar structures may coexist in the block diagram. In this case, one can be extracted from the other under appropriate restrictions. For these portions, the data structure and the information concerning the behaviors need not be inputted to the automatic design system or may be very little so that the logic designer can simply express the logic specification of the hardware system to be designed. The present invention is intended to reduce the design workload in the logic design phase according to the above-mentioned idea.

DESCRIPTION OF THE PREFERRED EMBODIMENT

The present invention will be described in detail in the following in connection with one embodiment thereof with refernce to the accompanying drawings.

Figure 1:
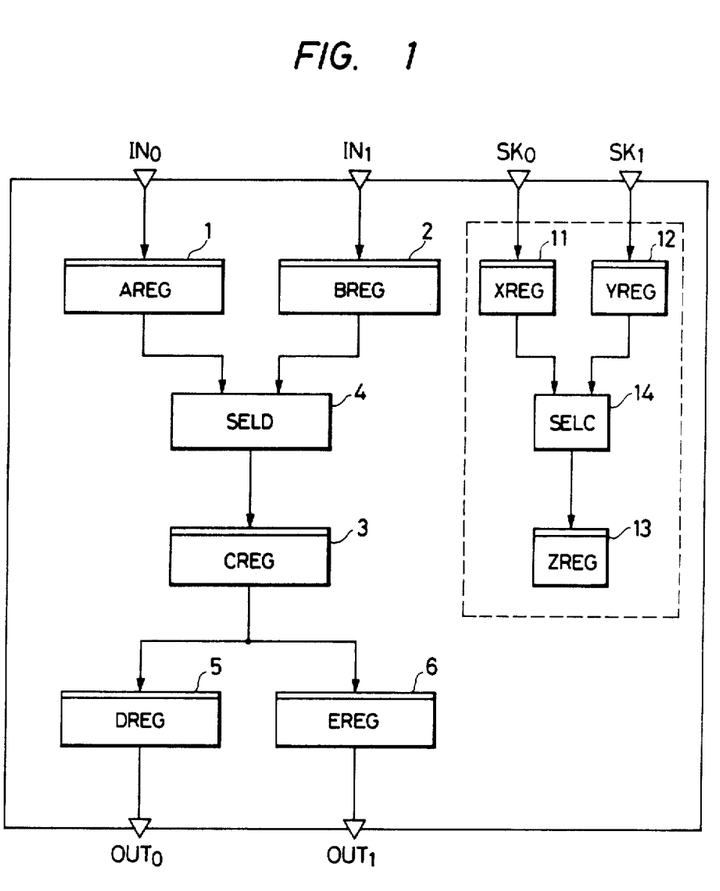
FIG. 1 is a block diagram showing one example of the digital hardware system to be designed by an automatic logic design system.

FIG. 1 presents a simple example of the hardware system to be designed. This hardware system is equipped with two input ports, each of which includes a data input port $IN_0$ (or $IN_1$) and a control information input port $SK_0$ (or $SK_1$), and two output ports $OUT_0$ and $OUT_1$. Data inputted from the port $IN_0$ are outputted through a register 1, a selector 4 and registers 5 and 6 to the output port $OUT_0$ or $OUT_1$. At this time, which output port, $OUT_0$ or $OUT_1$, the data are outputted to is determined by the control information inputted from the port $SK_0$. Similar paths are followed by the data inputted from the input port $IN_1$.

Next, the automatic logic design system for automatically designing that hardware system will be described in the following. Basically, this automatic logic design system generates a deficient internal data structure (e.g., a register) using the following information:

Internal Data Structure (e.g., Register); and Mode of Function (i.e., Logic Behavior of System).

Figure 2:
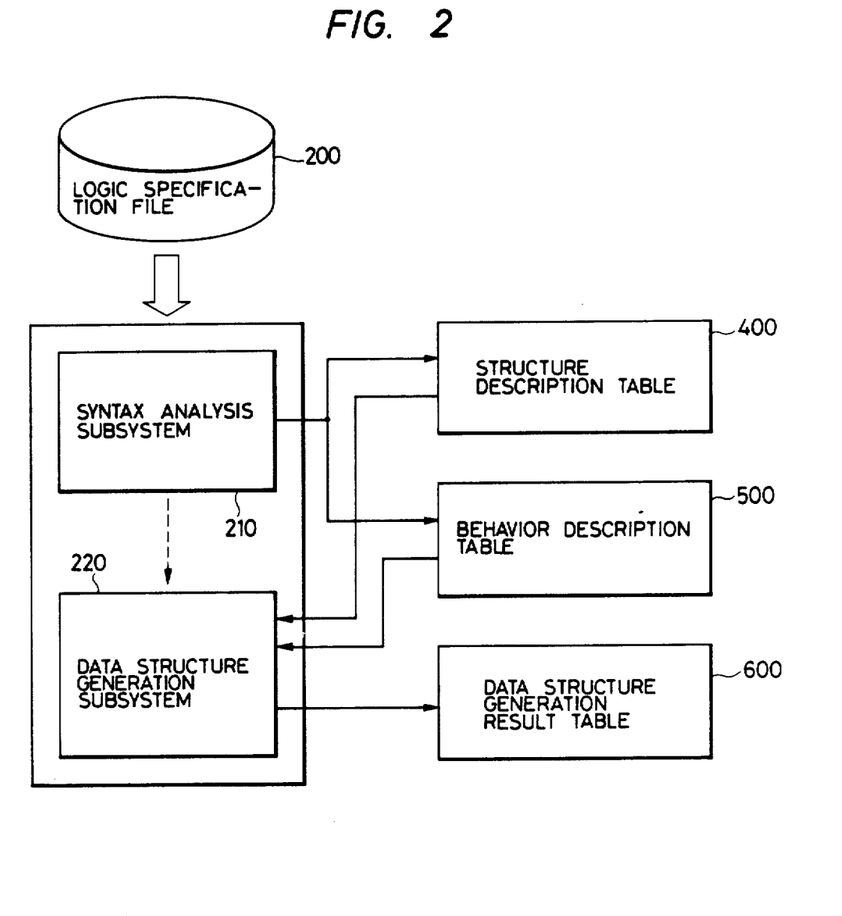
FIG. 2 is a block diagram showing one embodiment of the automatic logic design system of the present invention.

FIG. 2 shows one embodiment of the automatic logic design system of the present invention. This automatic logic design system is constructed of: a logic specification file 200 defined on the basis of hardware description languages; a syntax analysis subsystem made operative in response to the logic specification file 200; and three kinds of tables, i.e., a structure description table 400, a behavior description table 500 and a data structure generation result table 600.

The syntax analysis subsystem 210 is one for analyzing the structure and behavior descriptions expressed in the file 200 in accordance with the syntax rules to sfore the analysis results into the structure description table 400 and the behavior description table 500.

The data structure generation subsystem 220 conducts the following processings in resonse to the contents of the structure description table 400 and the behavior description table 500:

At a first step: the content of the behavior description table 500 is retrieved to locate a place where the data structure should be generated;

At a second step: the original form of the data structure to be generated is sought for from the information contained in the structure description table 400; and At a third step: the data structure to be generated is decided on the basis of the original form of the data structure sought for at the second step.

Figure 3:
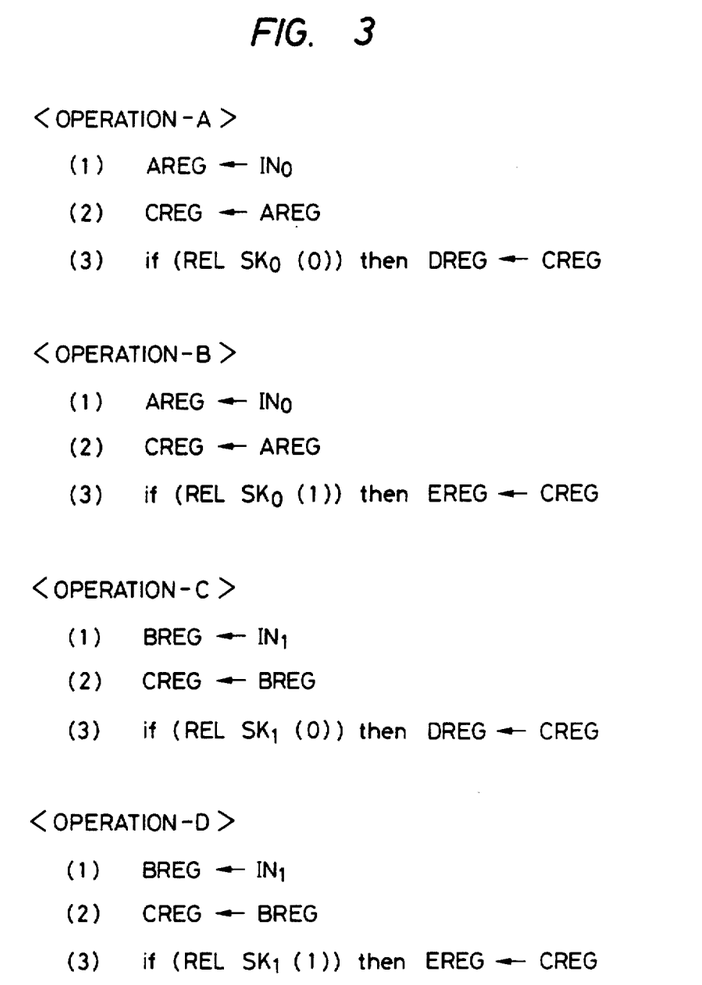
FIG. 3 is a diagram showing an example of the behavior description.

FIG. 3 is a diagram showing one example of the behavior description. The result of processing the behavior description in the syntax analysis subsystem 210 is stored in the structure description table 400 and the behavior description table 500.

Here, the assumption is made that the number of the functions to be processed by the hardware system shown in FIG. 1 is four - OPERATION-A to OPERATION-D, as show in FIG. 3. The OPERATION-A is composed of the following three unit operations:

(1) The data in the input port $IN_0$ are stored in the register 1 (AREG) shown in FIG. 1;

(2) In a subsequent cycle, the content of the register 1 (AREG) is transferred through the selector (SELD) to a register 3 (CREG); and (3) When the value of bit 0 (i.e., $SK_0(0)$) of the input signal $SK_0$ is at "1", the content of the register 3 (CREG) is transferred to the register 5 (DREG). The content of this register 5 is outputted from the output port $OUT_0$.

Other functions (OPERATIONS-B, C and D) have similar unit operations.

Here, in the unit operation (3), it should be noted that a key word REL is used to refer the input signal $SK_0$ is referred to. This key word indicates not only the reference to the information from the input signal $SK_0$ in the data transfer (DREG←CREG) but also the necessity fro generating the data structure such as a register for holding the information inputted from the input signal $SK_0$.

Figure 4:
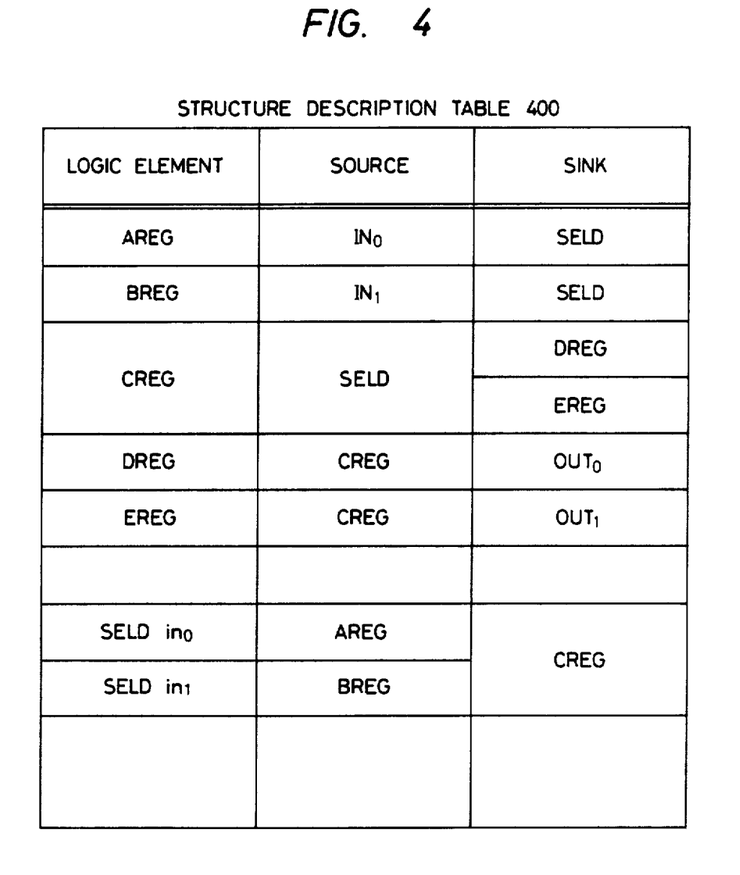
FIG. 4 is a diagram showing a specification of the structure description table.

FIG. 4 shows the structure description table. Logic elements are hardware components such as the registers, memories or selectors in the hardware system. The structure description table 400 enumerates the wiring connections of those logic elements and is composed of columns enumerating the logic elements, the respective sources of the elements, and the respective destinations of the elements.

Figure 5:
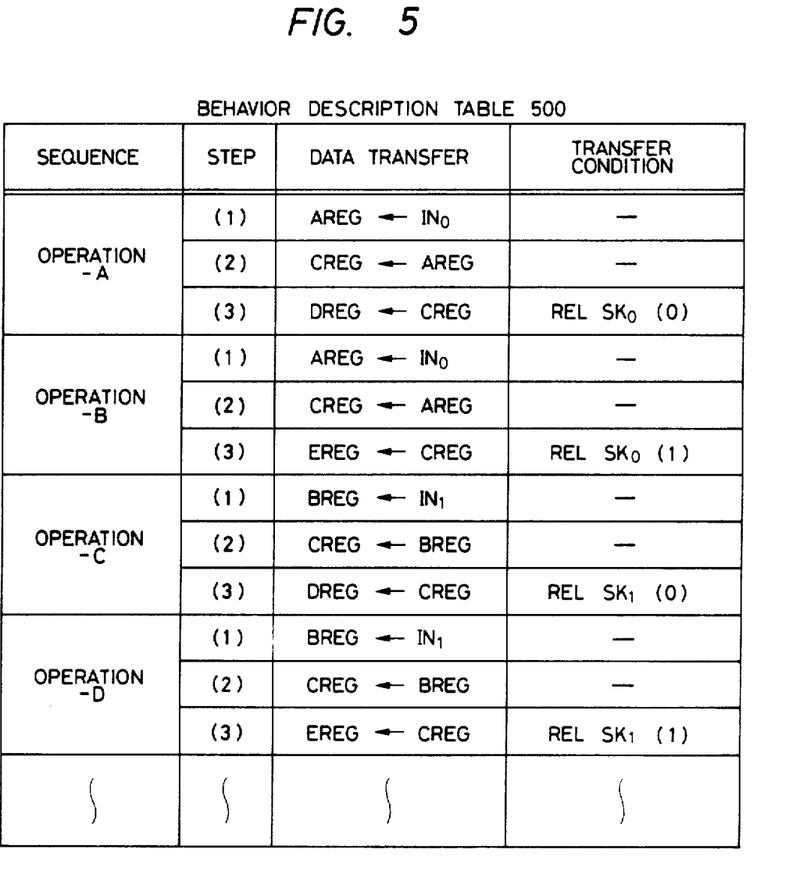
FIG. 5 shows a diagram showing a specification of the behavior description table.

FIG. 5 presents the behavior description table 500. This table is composed of four columns enumerating sequences indicating the kinds of behaviors, the respective steps of the sequences, the respective data transfers of the steps, and the transfer conditions for activating the respective data transfers.

The processings of the data structure generation subsystem will be described in the following with reference to FIGS. 6(a) to 6(c).

PROCESSING PROCEDURE 1

The transfer conditions are retrieved for each unit operation of the behavior description table 500 shown in FIG. 5 to examine whether or not the key word REL is present. FIG. 5 presents four RELs. The input signal $SK_0$ is referred to in the OPERATION-A when the content of the CREG is transferred to the DREG and in the OPERATION-B when the content of the CREG is transferred to the EREG. In the OPERATION-C and OPERATION-D, on the other hand, the input signal $SK_1$ is referred to when the content of the CREG is transferred to each of the registers DREG and EREG.

Figure 6A:
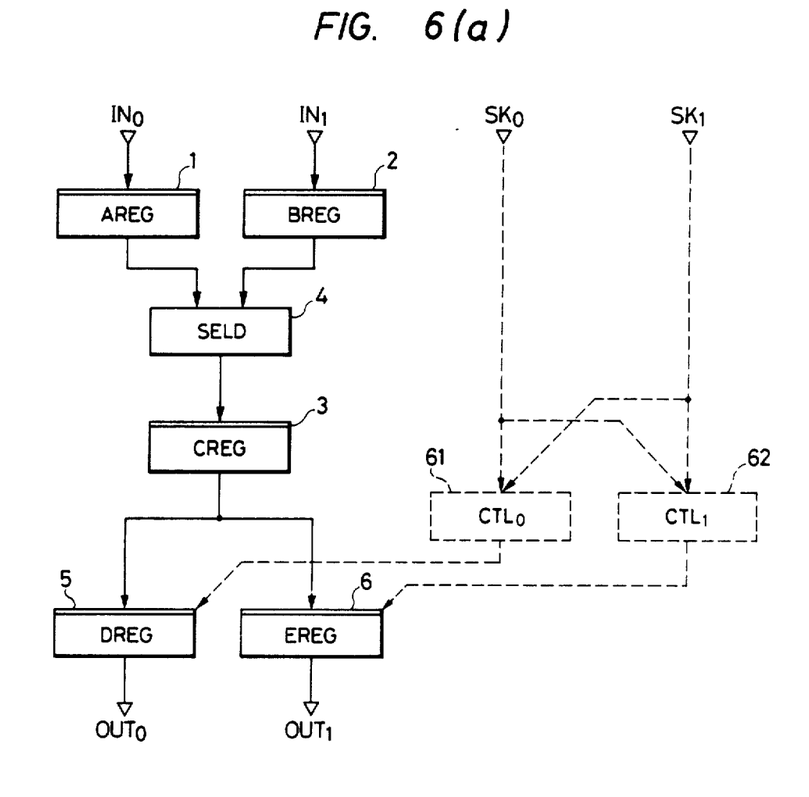
FIGS. 6(a), 6(b) and 6(c) are diagrams showing a data structure generation processes.

The automatic logic design system recognizes that it is requires to generate a data structure which connects the input signals $SK_0$ and $SK_1$ with control logic groups 61 and 62 ($CTL_0$ and $CTL_1$), as shown in FIG. 6(a).

PROCESSING PROCEDURE 2

The data structure to be generated is determined on the basis of the data transfer of the behavior description table 500 of FIG. 5. More specifically, as the use of the key word REL occurs at the data transfer (i.e., in the case of the OPERATION-A) from the register CREG to the register DREG, the source CREG in this transfer is a key element to generate the data structure.

Subsequently, the input port $IN_0$ is detected by backward tracing the unit operations of the OPERATION-A from CREG. The registers detected by in this tracing process are the AREG and CREG.

Figure 6B:
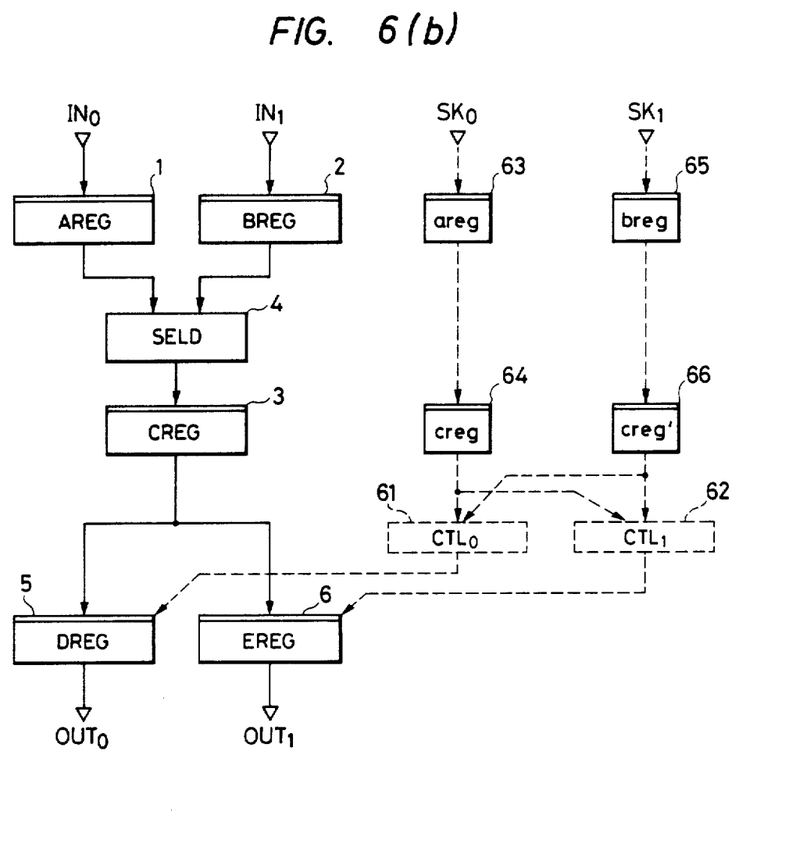
Figure 6C:
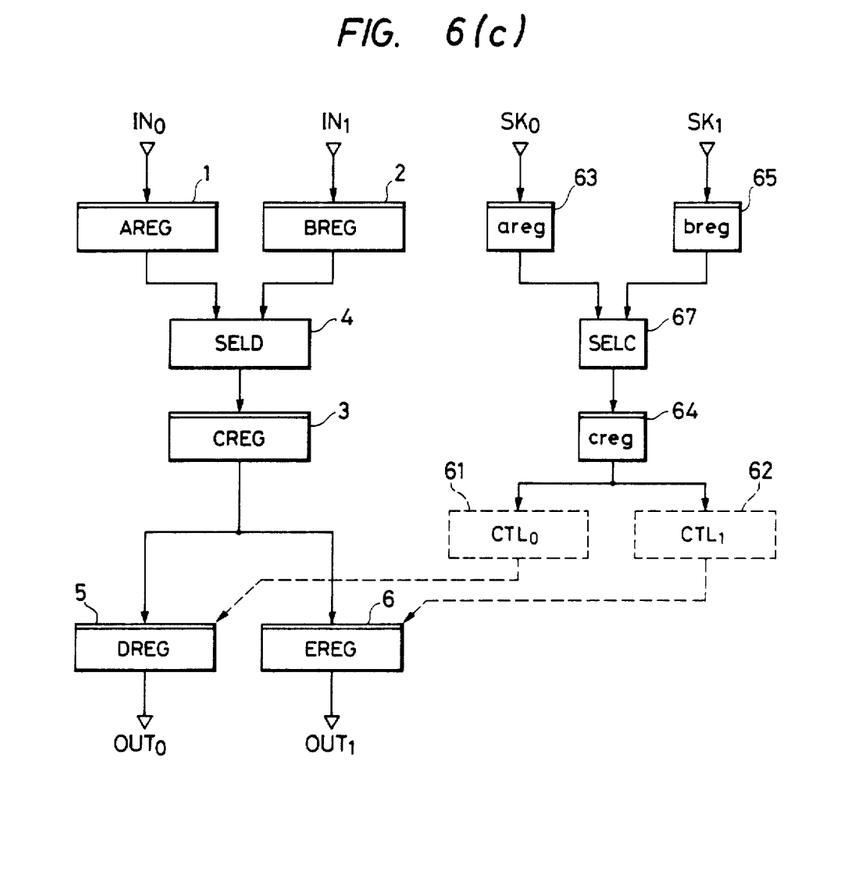
Figure 7:
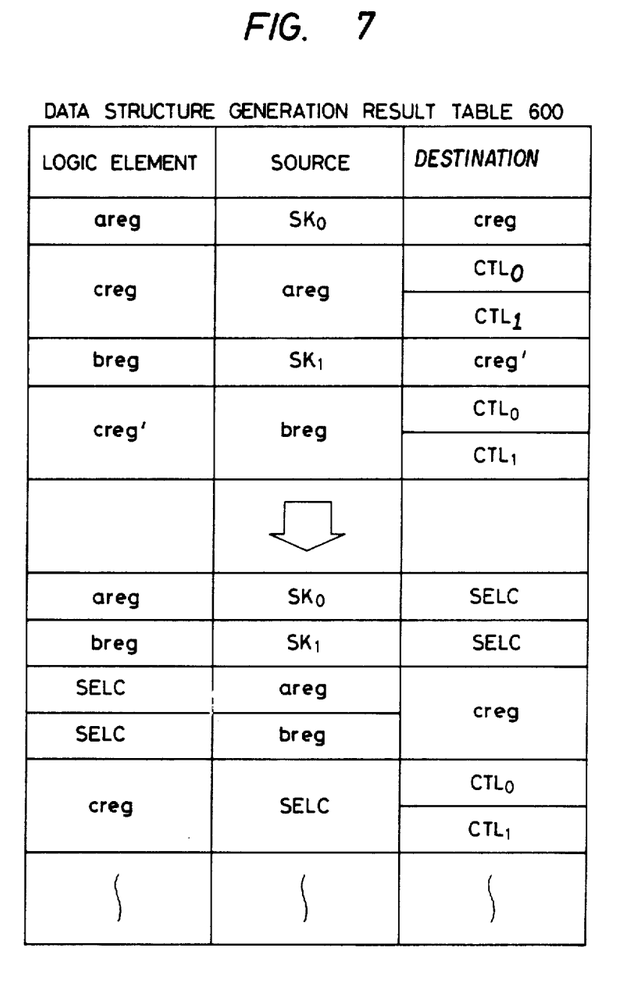
FIG. 7 is a diagram showing a specification of a data structure generation result table.

As shown in FIG. 6(b), therefore, registers 63 (areg) and 64 (creg) are assigned to correspond to the registers AREG and CREG and are connected with the input information $SK_0$ and the control signals 61 and 62 ($CTL_0$ and $CTL_1$). The registers assigned here are stored in the data structure generation result table 600, as shown in FIG. 7.

It should be noted that the data stored in the table 600 are transient but not final results.

Since, moreover, the same registers 63 and 64 as the aforementoined ones are generated from the key work REL shown in the OPERATION-B, nothing is newly stored in the table 600. This is because the input information referred to for the key word REL is the common $SK_0$ and the source in the data transfer is the common CREG.

From the key word REL appearing in the OPERA-TION-C, on the other hand, registers 65 (breg) and 66 (creg') are generated which correspond to the registers 2 (BREG) and 3 (CREG), respectively, as shown in FIG. 6(b) and are stored in the data structure generation result table 600. These are also transient.

PROCESSING PROCEDURE 3

Of the registers thus generated, both the registers 64 (creg) and 66 (creg') correspond to the register 3 (CREG). Therefore, the register 66 is redundant in this case and is accordingly eliminated and integrated into the register 64. As a result, as shown in FIG. 6(c), a selector 67 (CELC) is generated to correspond to the selector 4 (SELD). In conformity with this change, it required to eliminate the redundant logic element (e.g., creg' in this case), to register a novel logic element (e.g., SELC in this case) and to change the source and sink of each logic element in the table 600.

As has been explained in the processing procedures 1 to 3 thus far described, the data structure expressed implicitly in the logic specification description can be automatically generated by making the most use of the information described in the logic specification description.

Figure 8:
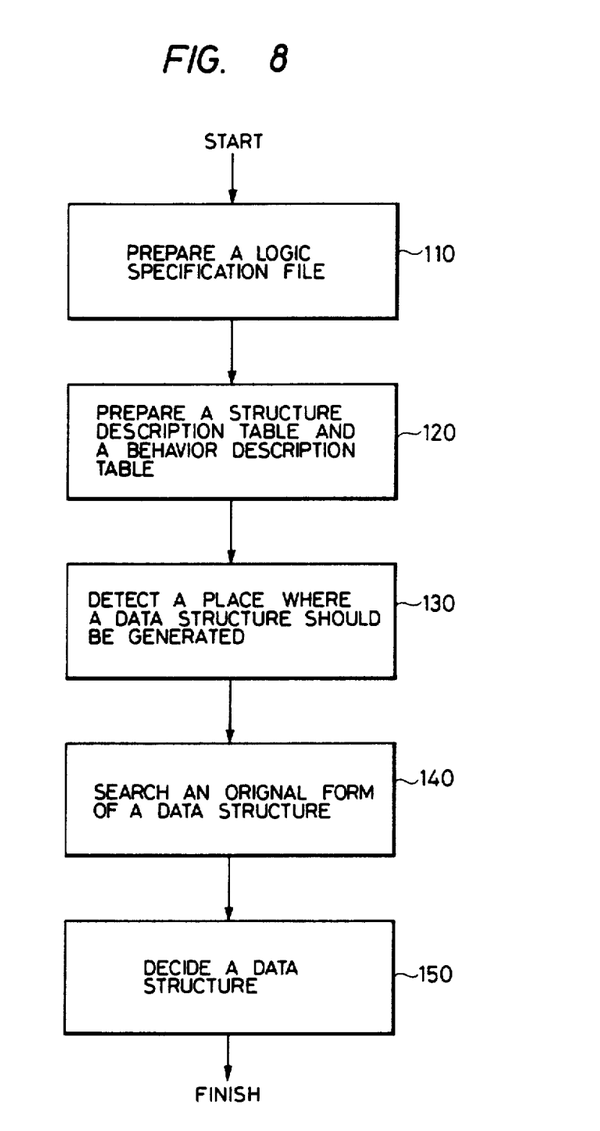
FIG. 8 is a flowchart showing the system of the present invention.

FIG. 8 is a flowchart showing the system of the present invention.

In a block 110, the data structure and function of a hardware system are expressed in a hardware description language by the structure and behavior descriptions to prepare the logic specification file.

In a block 120, the content of the logic specification file is analyzed by the syntax analysis subsystem 210 to prepare the structure description table 400 and the behavior description table 500. Here, the preparation of the structure description table is conducted by storing the analysis result in each field of the logic element, source and destination. On the other hand, the preparation of the behavior description table is conducted by storing the analysis result in each field of the sequence, step, data transfer and transfer condition.

In a block 130, the behavior description table 500 is retrieved to detect a place where the data structure should be generated. For this detection, the behavior description bearing the key word REL is first retrieved. Next, a logic element for providing the source of the behavior description retrieved is discriminated.

In a block 140, the original form of the data structure to be generated is searched from the information of the structure description table 400. In this case, the information of the behavior description table 500 may be referred to. All the logic elements for providing the sources discriminated in the block 130 are subjected to the following processings:

1. The transfer description is traced backward from the source logic element;
2. The trace is terminated when the input signal is detected;
3. In a manner of corresponding to the logic element of the original form of the data structure discriminated in the tracing process, there is generated a new logic element, which is stored in the field of the logic element of the data structure generation result table 600; and
4. The connection relationship between the logic elements registered in the data structure generation result table 600 is determined and is stored in each field of the source and destination of the data structure generation result table.

In a block 150, the following processings are conducted to decide the data structure to be generated:

1. An examination is performed to detect whether or not multiple new logic elements are stored in the table 600 for one logic element of the original form of the data structure traced;
2. Multiple logic elements are integrated, in case they are generated for one logic element of the original form of the data structure, into one entry; and
3. In case the sources of multiple logic elements to be integrated are different, a new selector is generated to avoid any conflict in the data transfer and is stored in the data structure generation result table to test the winding connection.

In case data structures having similar constructions are present in a hardware system, as has been described hereinbefore, it is possible to derive one data structure from one structure description and one transfer behavior description of the other data structure, so that the logic designer can express the specification of the hardware system to be designed in a simple manner.

What is claimed is:

1. An automatic logic design system for accomplishing the logic design of a hardware system by a computer, comprising:
    a logic specification file comprising structure and behavior descriptions of a logic system;
    a syntax analysis subsystem for receiving the structure and behavior descriptions from said logic specification file and having a syntax rule for analyzing the structure and behavior descriptions;
    structure description table means for storing results of analyzing the structure description in the syntax analysis subsystem;
    behavior description table means for storing results of analyzing the behavior description in the syntax analysis subsystem along with a key word indicating necessity for generating a data structure comprising logic elements;
    a data structure generation subsystem having means for retrieving from said behavior description table means a location where the data structure should be generated, means for seeking an original form of the data structure in the structure description table, and means for deciding the data structure on the basis of the original form using the key word; and
    data structure generation result table means for storing the data structure obtained from the data structure generation subsystem.

2. An automatic logic design system according to claim 1, wherein said data structure generation result table comprises means for eliminating a redundant logic element in the data structure.

3. An automatic logic design system according to claim 1 wherein said data structure generation result table comprises means for registering a novel logic element in the data structure.

4. An automatic logic design system according to claim 1, wherein said data structure generation result table comprises means for changing a source and a destination of each logic element in the data structure.

5. A method of conducting the logic design of a hardware system by a computer, comprising the steps of:
    filing structure and behavior descriptions of a logic system;
    analyzing the structure and behavior descriptions in accordance with a syntax rule file;
    storing results of analyzing the structure description into a first table;
    storing results of analyzing the behavior description into a second table along with a key word indicating necessity for generating a data structure comprising logic elements;
    retrieving from said second table a location where the data structure should be generated;
    seeking an original form of the data structure in the first table;
    deciding the data structure on the basis of the original form using the results stored in the second table and the key word; and
    storing the data structure obtained from the deciding step into a third table.

6. A method according to claim 5, further comprising the step of eliminating a redundant logic element in the data structure.

7. A method according to claim 5, further comprising the step of registering a novel logic element in the data structure.

8. A method according to claim 5, further comprising the step of changing a source and a destination of each logic element in the data structure.

* * * * *